United States Patent
Papenbreer et al.

(10) Patent No.: US 10,937,611 B2
(45) Date of Patent: Mar. 2, 2021

(54) SAFETY SWITCH

(71) Applicant: Rockwell Automation Switzerland GmbH, Aarau (CH)

(72) Inventors: Rudolf Papenbreer, Wuppertal (DE); Stefan Klein, Mettmann (DE)

(73) Assignee: Rockwell Automation Switzerland GMBH

( * ) Notice: Subject to any disclaimer, the term of this patent is extended or adjusted under 35 U.S.C. 154(b) by 93 days.

(21) Appl. No.: 16/119,299

(22) Filed: Aug. 31, 2018

(65) Prior Publication Data

US 2019/0096611 A1 Mar. 28, 2019

(30) Foreign Application Priority Data

Sep. 29, 2017 (EP) .................................... 17194126

(51) Int. Cl.
*H01H 27/00* (2006.01)
*H01H 47/00* (2006.01)
(Continued)

(52) U.S. Cl.
CPC ....... *H01H 27/002* (2013.01); *G01R 31/3278* (2013.01); *G05B 9/02* (2013.01);
(Continued)

(58) Field of Classification Search
CPC ........ H01H 27/00; H01H 27/002; H01H 9/54; H01H 47/00; H01H 47/005; H01H 3/02;
(Continued)

(56) References Cited

U.S. PATENT DOCUMENTS 5,514,964 A * 5/1996 Benesh .................. G01R 31/50
324/509
2008/0042639 A1* 2/2008 Oster ............... H03K 19/01757
324/133

(Continued)

FOREIGN PATENT DOCUMENTS

CN 101180698 A 5/2008
CN 102089962 A 6/2011
(Continued)

OTHER PUBLICATIONS

1st Chinese Office Action with Search Report dated Aug. 2, 2019; Chinese Patent Application No. 201811146370.0—(7) pages.

*Primary Examiner* — Son T Le
(74) *Attorney, Agent, or Firm* — Boyle Fredrickson, SC (57) ABSTRACT

A safety switch device configured to perform at least one of connecting a load to a power supply and disconnecting the load from the power supply is provided. The safety switch device comprises a first set of two serially connected controllable switching elements; a safety circuit to verify a switching state of the first set of two switching elements, wherein each switching element of the first set of two switching elements is configured as a toggle; a control circuit configured to provide a test signal to the safety circuit; and decoupling means configured to galvanically decouple the load circuit from the control circuit. The decoupling means comprise a transformer, and the control circuit comprises a transformer driver configured to provide the test signal to the safety circuit via the transformer.

20 Claims, 5 Drawing Sheets

(51) Int. Cl.
  *G05B 9/02* (2006.01)
  *H01H 9/54* (2006.01)
  *G01R 31/327* (2006.01)
  *H03K 17/18* (2006.01)
  *H01H 3/02* (2006.01)

(52) U.S. Cl.
  CPC ............ *H01H 9/54* (2013.01); *H01H 47/005* (2013.01); *H03K 17/18* (2013.01); *H01H 3/022* (2013.01)

(58) Field of Classification Search
  CPC ...... H01H 3/022; H01H 47/004; H03K 17/18; G01R 31/327; G01R 31/3278; G05B 9/02
  See application file for complete search history.

(56) References Cited

U.S. PATENT DOCUMENTS

| | | | |
|---|---|---|---|
| 2009/0251835 A1* | 10/2009 | Meinherz | H01H 47/004 361/91.1 |
| 2011/0133763 A1* | 6/2011 | Schulte | G01R 31/327 324/750.01 |
| 2011/0161708 A1 | 6/2011 | DuBose | |
| 2016/0225561 A1* | 8/2016 | Fukumoto | H01H 47/22 |
| 2018/0172174 A1* | 6/2018 | Gardt | B60T 8/171 |
| 2020/0006979 A1* | 1/2020 | Lin | H02J 9/062 |

FOREIGN PATENT DOCUMENTS

| | | |
|---|---|---|
| CN | 102376148 A | 3/2012 |
| CN | 105845503 A | 8/2016 |

\* cited by examiner

SAFETY SWITCH

CROSS-REFERENCE TO RELATED APPLICATIONS

This application claims priority to European Application No. 17194126.3, filed Sep. 29, 2017, the entire contents of which is incorporated herein by reference.

BACKGROUND INFORMATION

The subject matter disclosed herein relates to a safety switch device and, more specifically, to safety switch devices for verifying a switching state of switching elements and to a method for operating a safety switch device.

Safety switch devices typically have at least one switching element for connecting a load to a power supply and/or disconnecting a load from a power supply. Typically, the safety switch device is constructed for failsafe operation and, if appropriate, indicates a status of the at least one switching element to determine if the safety switch device is functional. In this regard, the technical complexity of such safety switch devices increases as the respective safety requirements become more stringent.

A relay is a well-known component to electrically perform a switching operation. In many fields, for example, high power electronics, it is important to know if a relay is functional or working properly. Errors that may occur during operation of a safety switch device are, for example, that relay contacts may be welded, so that the relay can no longer be controlled or opened. Another fault condition may be that a transistor breaks down and thus causes a short circuit which prevents interruption of the electrical power supply path to the load. In order to cope with such faults, safety switch devices are generally designed with multiple channel redundancy, so that, for example, in the event of failure of one switching element, a redundant switching element arranged in series can interrupt the electrical power supply path.

However, a redundant implementation itself is not sufficient to achieve certain safety requirements, Additionally, a fault condition needs to be detected. For this purpose, safety relevant relays can be used.

Safety relevant relays are often force guided relays. These relays comprise a plurality of mechanically connected contacts in order to be able to monitor the other contacts. The contacts comprise two kinds of states, namely "normally open" and "normally closed", wherein at least one contact is "normally open" and the remaining (at least one) contacts are "normally closed". "Normally open" or "normally closed" means that this switching position is assumed in a de-energized state of the relay.

Mechanical guiding (forced guiding) makes it impossible to close the "normally closed" and "normally open" contact simultaneously. If a "normally closed" contact becomes welded, it must be impossible for the "normally open" contacts to close when the coil of the relay is energized. Accordingly, at least one contact can be used to monitor the other contacts of the relay. This allows determining whether the relay is operating correctly. Moreover, this kind of safety mechanism is often used to achieve a certain safety level for the relay.

EP 2 089 892 B1 discloses a solution for monitoring relay contacts without a positively driven monitoring contact. A safety switch system is provided for turning on and off a power supply of a load with at least one controllable switching element, in particular, a relay, and a safety circuit to verify a switching state of the switching element, whereby the switching element is configured as a toggle. Electrical decoupling means in the form of a capacitor and/or an optocoupler are provided in order to decouple the safety circuit from the power supply of the load. However, decoupling means in the form of a capacitor and/or an optocoupler have some drawbacks as will be explained below.

BRIEF DESCRIPTION

It is an object of the present invention to provide an improved safety switch device to verify a switching state of one or more switching elements.

This object is solved by the subject matter of the independent claims.

Embodiments are defined by the dependent claims.

The present invention relates to a safety switch device for connecting and disconnecting a load to/from a power supply. The safety switch device comprises two serially connected controllable switching elements, which according to an embodiment are relays, and a safety circuit to verify a switching state of the switching element. The switching elements are configured as a toggle having a first contact electrically connected to either a second contact or a third contact. The safety circuit comprises the second contact and the load circuit comprises the third contact. The safety switch device further comprises a control circuit configured to provide a test signal to the safety circuit. The test signal is provided to the safety circuit via a transformer that functions as decoupling means to galvanically decouple the control circuit from the load circuit. The control circuit comprises a transformer driver configured to provide the test signal to the safety circuit via the transformer.

The present invention provides an improved safety switch device to detect a fault position of switching elements in a reliable way. Thus, the safety switch device may provide for safe operation of the switching device. Advantageously, the present invention may be used for high current relays.

According to an aspect of the present invention, an improved safety switch device is provided that can work with a transformer for inductively providing a test signal to the safety circuit. Advantageously, the present invention with the transformer solution allows for a high and continuous monitoring/testing current. Conventional solutions that instead have capacitors to decouple the control circuit from the power supply provide merely for pulses in a safety circuit that are difficult to detect. Accordingly, the present invention may facilitate the detection of a provided test signal in a more reliable way. Another aspect of the present invention is to provide a monitoring current adjustable via the transformer.

Another aspect of the present invention is to provide an improved safety switch device in view of a more cost efficient safety switch device. For example, in contrast to the present invention that may use standard relays, common forced guided relays in safety switch systems are more expensive. The procedure according to the present invention makes it possible to use conventional "SMD" relays which are smaller and more cost-effective than positively driven relays with a monitoring contact, which are otherwise required.

Further, another aspect of the present invention is to provide an improved safety switch device that may work with fewer components compared to prior art safety switch devices and, accordingly, the improved safety switch device of the present invention saves space or allows for a more efficient usage of space.

Another aspect of the present invention is to provide an improved safety switch device with a longer or enhanced relay life expectation.

One embodiment of the present invention provides for a transformer having a primary winding and two secondary windings forming a first transformer and a second transformer. According to another embodiment, the safety switch device further comprises a second safety circuit, wherein the second safety circuit comprises a second set of two serially connected controllable switching elements. In another embodiment, the second safety circuit comprising a second set of two serially connected controllable switching elements may be electrically connected to the second transformer, and the first safety circuit comprising the first set of two serially connected controllable switching elements may be electrically connected to the first transformer. This advantageously provides for an improved safety switch device capable of providing different test signals, depending on the windings of the first and second transformer, to the first and the second safety circuit. According to this embodiment, the safety circuits of the safety switch device are galvanically decoupled guarding each safety circuit against short circuits occurring in the other safety circuit, Additionally, test signals can be provided to a plurality of safety circuits via only one transformer. Conventional systems use different test signal sources for each safety circuit. Accordingly, the safety switch device may reduce costs and occupy less space.

One aspect of the present invention may be to provide an improved safety switch device by using cross fault detection of switching elements. This may allow determining a fault condition in a more reliable manner.

In one embodiment of the present invention, the safety switch device comprises an optocoupler. The optocoupler may be configured to indicate the switching state. Moreover, the optocoupler may be configured to indicate whether the first set of two switching elements is in a switching position of a de-energized state, in which the first set of two switching elements close the safety circuit. This facilitates detection of a test signal to verify a switching position.

In one embodiment of the present invention, a safety switch device is provided, wherein the safety switch device comprises a safety circuit comprising the first set of two serially connected controllable switching elements that are electrically connected to the first transformer; a second safety circuit, wherein the second safety circuit comprises a second set of two serially connected controllable switching elements being electrically connected to the second transformer; a third safety circuit, wherein the third safety circuit comprises a third set of two serially connected controllable switching elements being electrically connected to the first transformer; and a fourth safety circuit, wherein the fourth safety circuit comprises a fourth set of two serially connected controllable switching elements being electrically connected to the second transformer. One aspect of this embodiment is to provide an improved safety switch device using only one transformer for providing a test signal to a plurality (in this case four) of safety circuits to verify a switching position of two serially connected controllable switching elements in each of the safety circuits. Advantageously, a switching position of switching elements may be verified in a redundant and reliable manner, if two switching elements of different safety circuits are controlled and/or jointly driven by one relay. This allows a reliable detection of defective relays is.

In one embodiment of the present invention, at least one of the safety circuits further comprises one or more capacitors providing for a secondary insulation, wherein the transformer provides for a primary insulation. One aspect of this embodiment is to provide an improved safety switch device that can work with a transformer and additional capacitors that can provide for less secondary coils in the transformer. Moreover, using a transformer and one or more capacitors provides for double insulation. Accordingly, current may be controlled in an improved manner and the relay life expectation may be enhanced.

According to an embodiment of the present invention, a transformer driver is included for providing a test signal to the safety circuit via the transformer, wherein the transformer driver comprises a microprocessor for controlling a test signal being at least one of a continuous AC test signal and a temporary AC test signal. One aspect of this embodiment is to provide an improved safety switch device to verify a switching state of the switching elements in a flexible and reliable manner. Another aspect of this embodiment is to provide a monitoring current adjustable via the transformer and frequency selection. Accordingly, this embodiment allows for testing that can be continuous or temporary. Using a continuous AC test signal instead of individual pulses facilitates detection of the test signal.

In another embodiment of the present invention, a second microprocessor is provided, Wherein the second microprocessor receives a signal from the optocoupler, used to verify the switching state. One aspect of this embodiment is to provide an improved safety switch device comprising microprocessor monitored relays. In one embodiment, the microprocessor is separate from the second microprocessor. In another embodiment, the microprocessor and the second microprocessor are comprised in one component.

In one embodiment of the present invention, a PWM controlled transistor is provided that generates the test signal. The test signal can thus be provided in a flexible manner. For example, the test signal may be provided continuous or as pulses.

Furthermore, in one embodiment of the present invention, a method is provided for verifying a switching state of a first set of two switching elements, wherein the first set of two switching elements is configured to connect a load to a power supply and disconnect the load from the power supply. The method further comprises generating a test signal by a control circuit, providing the test signal to the safety circuit via a transformer that functions as decoupling means to galvanically decouple the control circuit, from the power supply of the load, and providing an indication of a switching state to verify the switching state of the first set of two switching elements.

In one embodiment the method further includes generating the test signal by a PWM controlled transistor comprised in the control circuit. According to an aspect, the method includes receiving the indication of the switching state at a microprocessor, wherein the indication of the switching state is provided by an optocoupler.

The following detailed description and accompanying drawings provide a more detailed understanding of the nature and advantages of the present invention.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description. Described herein are apparatuses and techniques for verifying a switching state of one or more switching elements. For purposes of explanation, numerous examples and specific details are set forth in order to provide a thorough understanding of the embodiments of the present invention. Embodiments as defined by the claims may include some or all of the features in these examples alone or in combination with other features described below and may further include modifications and equivalents of the features and concepts described herein. The following description will refer to FIGS. 1 to 5 explaining embodiments of the present invention in detail.

Figure 1:
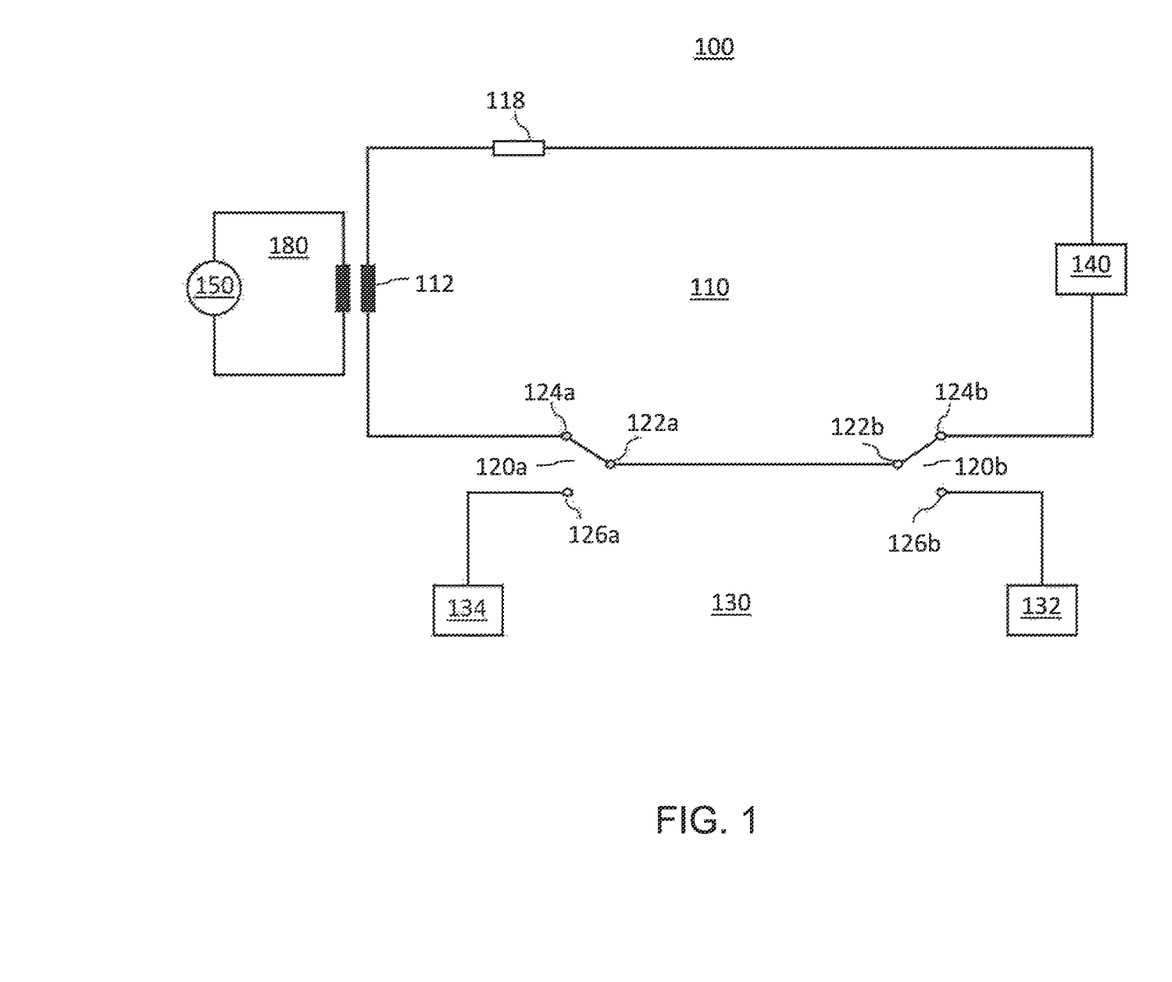
FIG. 1 is a circuit diagram illustrating a safety switch device for verifying a switching state of switching elements, according to an embodiment of the invention.

FIG. 1 depicts an embodiment of the present invention. In particular, FIG. 1 shows a safety switch device 100 configured to perform at least one of connecting a load 132 to a power supply 134 and disconnecting the load 132 from the power supply 134. The safety switch device 100 may comprise a first set of two serially connected controllable switching elements 120a and 120b, and a safety circuit 110 for verifying a switching state of the first set of two switching elements 120a and 120b, wherein the one or more switching elements 120a and 120b are configured as a toggle, such that a first contact 122a/122b is electrically connected either with a second 124a/124b or a third contact 126a/126b by means of a switching operation and the first contact 122a of switching element 120a is electrically connected to the first contact 122b of the switching element 120b of the first set of serially connected switching elements 120a and 120b. Thus, forming two serially connected switching elements.

The switching elements 120a and 120b may be drivable switching elements, in particular, relays.

The second contacts 124a and 124b of the one or more switching elements 120a and 120b are comprised in the safety circuit 110 and the third contacts 126a and 126b are comprised in the load circuit 130.

The load circuit 130 comprises the power supply 134 and the load 132 and may be closed by both switching elements 120a and 120b. The third contact 126a is, in this example, electrically connected to the power supply 134 and the third contact 126b of the switching element 120b is in this example electrically connected to the load 132. The load 132 and the power supply 134 can be connected interchangeably to the third contacts 126a and 126b. For example, in another embodiment, the third contact 126a of the switching element 120a is electrically connected to the load 132 and the third contact 126b of the switching element 120b is in this example electrically connected to the power supply 134.

The safety circuit 110 further comprises a transformer 112 and means for detecting a test signal 140. Moreover, the safety circuit may also comprise a resistance 118 and a capacitor (not shown). However, the safety switch device also functions without a capacitor. The second contact 124a of switching element 120a may be electrically connected to the transformer 112. The second contact 124b may be electrically connected to the means for detecting a test signal 140.

Accordingly, a closed safety circuit 110 is formed when the first and second contact 122a/122b and 124a/124b are electrically connected and a closed load circuit is formed when the first and third contacts 122a/122b and 126a/126b are electrically connected. The switching elements 120a and 120b connect the first contact 122a/122b and the second contact 124a/124b for the safety circuit 110 in a de-energized state of the relays of the respective switching elements 120a and 120b.

The means for detecting the test signal 140 allow for checking whether the two switching elements 120a and 120b are in the switching position in which the switching elements close the safety circuit. This may correspond to a switching position of a de-energized state. In particular, this corresponds to a switching position of a de-energized state of relays comprising the respective switching elements 120a and 120b. The means for detecting the test signal 140 may provide a detected test signal to an evaluation component, for example a microprocessor. The evaluation component evaluates and/or processes the detected test signal and determines a switching state of the first set of two switching elements 120a, 120b.

The safety switch device 100 further comprises a control circuit 180 comprising a transformer driver 150 and transformer 112. The transformer driver 150 is configured to provide a test signal to the safety circuit 110 via the transformer 112. The test signal may be a continuous AC test signal, a temporary AC test signal, a pulse or a modulated test signal. The transformer driver 150 may comprise a microprocessor and a driver (not shown).

An advantage of the present invention may be a higher and continuous current of the test signal which can be achieved with the transformer solution, which facilitates detection of the test signals. In contrast, conventional configurations with capacitors provide only for small pulses as test signals, which are difficult to detect.

The safety switch device 100 comprises decoupling means to galvanically decouple the control circuit 180 from the power supply 134 of the load 132, wherein the decoupling means comprise the transformer 112. The decoupling means not only ensure that the control circuit 180 is decoupled in the case of temporal switching differences of the relays, but if a relay fails and causes a short circuit, the decoupling means likewise ensure that a power supply 134 for the load 132 is decoupled from the control circuit and its components, like the transformer driver.

Figure 2:
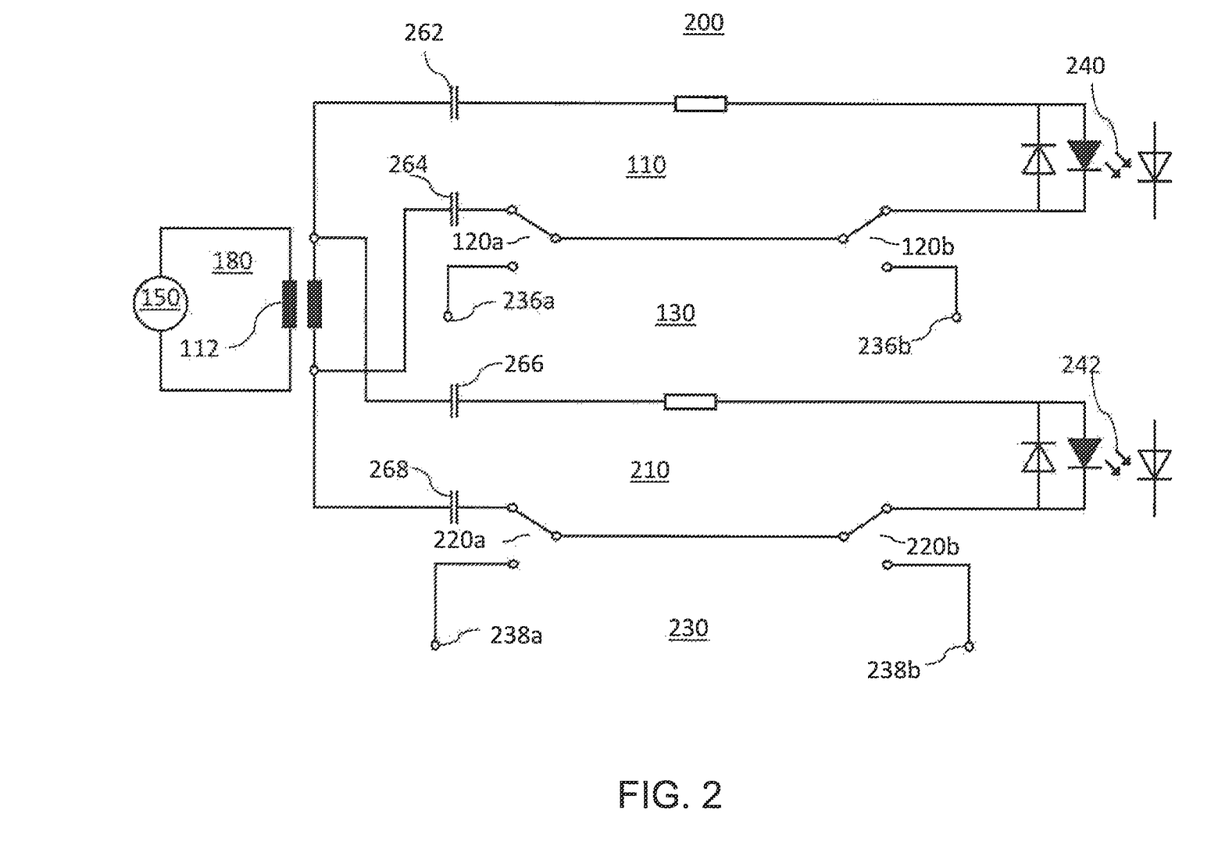
FIG. 2 is a circuit diagram illustrating a safety switch device comprising two safety circuits for verifying a switching state of switching elements, according to an embodiment of the invention.

FIG. 2 depicts another embodiment of the present invention. In particular, FIG. 2 shows a safety switch device 200 comprising two safety circuits 110 and 210, and two load circuits 130 and 230.

The first load circuit 130 comprises output terminals 236a and 236b. These terminals may be connected to a load and a power supply. The second load circuit 230 comprises the output terminals 238a and 238b. Both load circuits 130 and 230 may be electrically connected by switching elements 120a/120b and 220a/220b, respectively.

The first safety circuit comprises an optocoupler 240 that is electrically connected to the switching element 120b. The optocoupler 240 may provide as an output an input for a microprocessor (not shown) to automatically verify a switching state of the switching elements. The input may be a detected signal. The input may be an indication of a switching state of the switching elements 120a and 120b to verify the switching state of the switching elements 120. Moreover, the optocoupler provides for a component of the safety circuit that galvanically decouples the microprocessor (not shown) from the safety circuit and the load circuit. The optocouplers 240 and 242 not only ensure that the microprocessor and/or evaluation circuit is decoupled in the case of temporal switching differences of the relays, but if a relay fails and causes a short circuit, the optocouplers 240 and 242 likewise ensure that a power supply for the load is decoupled from the monitoring electronics comprising the microprocessor for evaluating the test signal.

In one embodiment, the microprocessor that receives an input from the optocoupler can evaluate the input and determine the switching states of the switching elements or the relays. The microprocessor may use other signals from other sources to verify the switching state of the switching elements. Other signals may comprise signals indicating a switching state, in which the relays are supposed to be, for example, a relay status signal.

In one embodiment, the microprocessor that receives the input from the optocoupler may be separate from the microprocessor comprised in the control circuit and/or transformer driver 150. In another embodiment, the microprocessor that receives an input from the optocoupler may be the same microprocessor as the microprocessor comprised in the transformer driver 150. This allows for an integrated feedback loop to evaluate the input from the optocoupler and determine the switching states of the switching elements or the relays.

The second safety circuit 210 also comprises transformer 112 and further comprises switching elements 220a and 220b. These switching elements 220a and 220b may be electrically connected to an optocoupler 242 and a capacitor 268, if the safety circuit is closed by the switching devices 220a and 220b.

For example, the switching elements 120a, 120b, 220a and 220b may be connected to one or more relays. In particular, switching element 120a may be a first contact for a first relay and switching element 220a may be a second contact for the first relay. Further, switching element 120b may be a first contact for a second relay and switching element 220b may be a second contact for the second relay. Accordingly, each of the first and second relay forms a group of switching elements comprised in different safety circuits. The first relay is configured to simultaneously open two safety circuits or two load circuits, and the second relay is configured to simultaneously open the same two safety circuits or two load circuits. However, to close the two safety circuits or two load circuits, both relays must be in the same switching position.

Alternatively, one relay is configured to control only one switching element. Accordingly, the switching elements 120a, 120b, 220a and 220b are each controlled by a separate relay.

These relays include change over contacts. In an energized state of the relays, the relays close the load circuits by electrically connecting a load with a power supply and open the safety circuits. In a de-energized state of the relays, the relays close the safety circuits and open the load circuits by electrically disconnecting a load from a power supply. In one embodiment, the testing of the relays can only be performed, if the relays are de-energized.

The relays of the respective switching elements 120a, 120b, 220a and 220b, as depicted in FIG. 2, are currently in a de-energized state and allow the verification of the switching state via the safety circuit. Accordingly, the safety circuit may be used as a feedback loop to verify the de-energized switching state of the switching elements and/or relays.

As depicted in FIG. 2, the safety circuit may also comprise one or more capacitors 262, 264, 266 and 268. The capacitors 262, 264, 266 and 268 may be electrically connected to the optocouplers 240 and 242, and the transformer 112. The combination of capacitors 262, 264, 266 and 268 and transformer 112 allows for galvanically decoupling the safety circuit from a power supply of a load in an improved manner. The transformer 112 can be regarded as a primary insulation and the capacitors 262, 264, 266 and 268 can be regarded as a secondary insulation. Accordingly, the capacitors 262, 264, 266 and 268 provide for an additional insulation between the safety circuit and the load circuits. Decoupling means that comprise transformer 112 and capacitors 262, 264, 266 and 268 allow reducing the coils of the transformer 112. Thus, this assembly may save costs and/or allows for cheaper transformers.

In another embodiment, instead of capacitors 262, 264, 266 and 268 as a secondary insulation, a transducer, for example, an optocoupler or a transformer is likewise conceivable as the secondary insulation.

Moreover, using a transformer 112 and one or more capacitors 262, 264, 266 and 268 provides double insulation and control over feedback current. This may improve relay life expectations.

Figure 3:
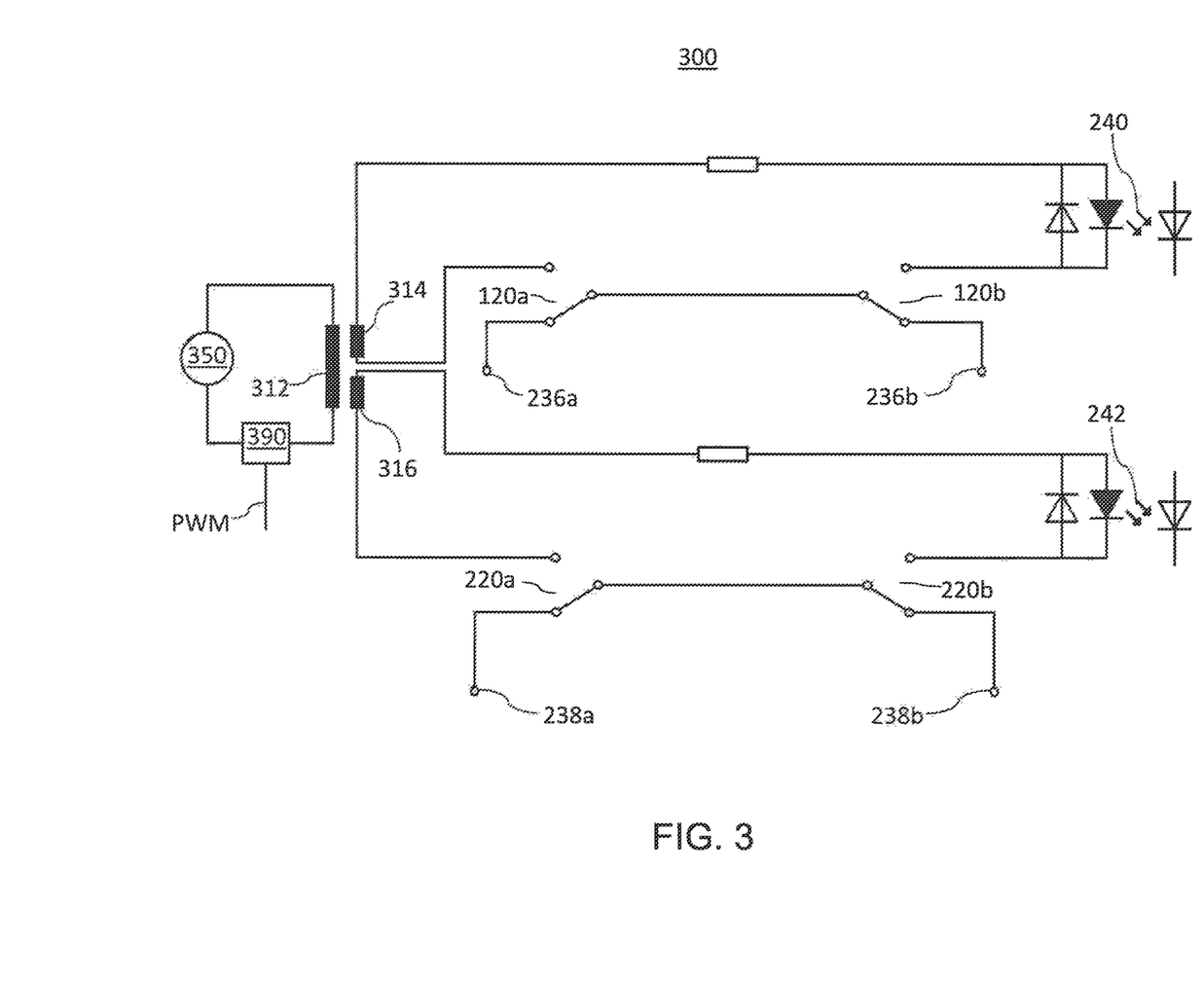
FIG. 3 is a circuit diagram illustrating a safety switch device comprising a transformer arrangement forming a first and a second transformer for providing two safety circuits with a test signal generated by a PWM controlled transistor, according to another embodiment of the invention.

FIG. 3 depicts another embodiment of the present invention. The safety switch device 300 of FIG. 3 comprises two safety circuits and two load circuits. In contrast to FIGS. 1 and 2, which show the switching position of the switching elements closing the safety circuit, FIG. 3 shows the switching position of the switching elements 120 and 220 closing the load circuit. The switching elements 120a, 120b, 220a and 220b, in particular respective relays, as depicted in FIG. 3, are currently in an energized state. This switching position opens the respective safety circuits and does not allow the verification of the switching state by means of a test signal via the safety circuit.

Furthermore, the safety switch device 300 comprises a transformer driver 150 for providing a test signal to the safety circuits via the transformer 312. The transformer driver 150 comprises a power source 350 and a PWM controlled transistor 390 to configure and/or generate the test signal for the safety circuits.

The transformer 312 comprises a primary winding forming a first transformer 314 and a secondary winding forming a second transformer 316. The first transformer 314 is electrically connected to an optocoupler 240 and switching element 120*a* of the first safety circuit and the second transformer 316 is electrically connected to an optocoupler 242 and switching element 220*a* of the second safety circuit. Accordingly, the first transformer forms a part of the first safety circuit and the second transformer forms a part of the second safety circuit.

Figure 4:
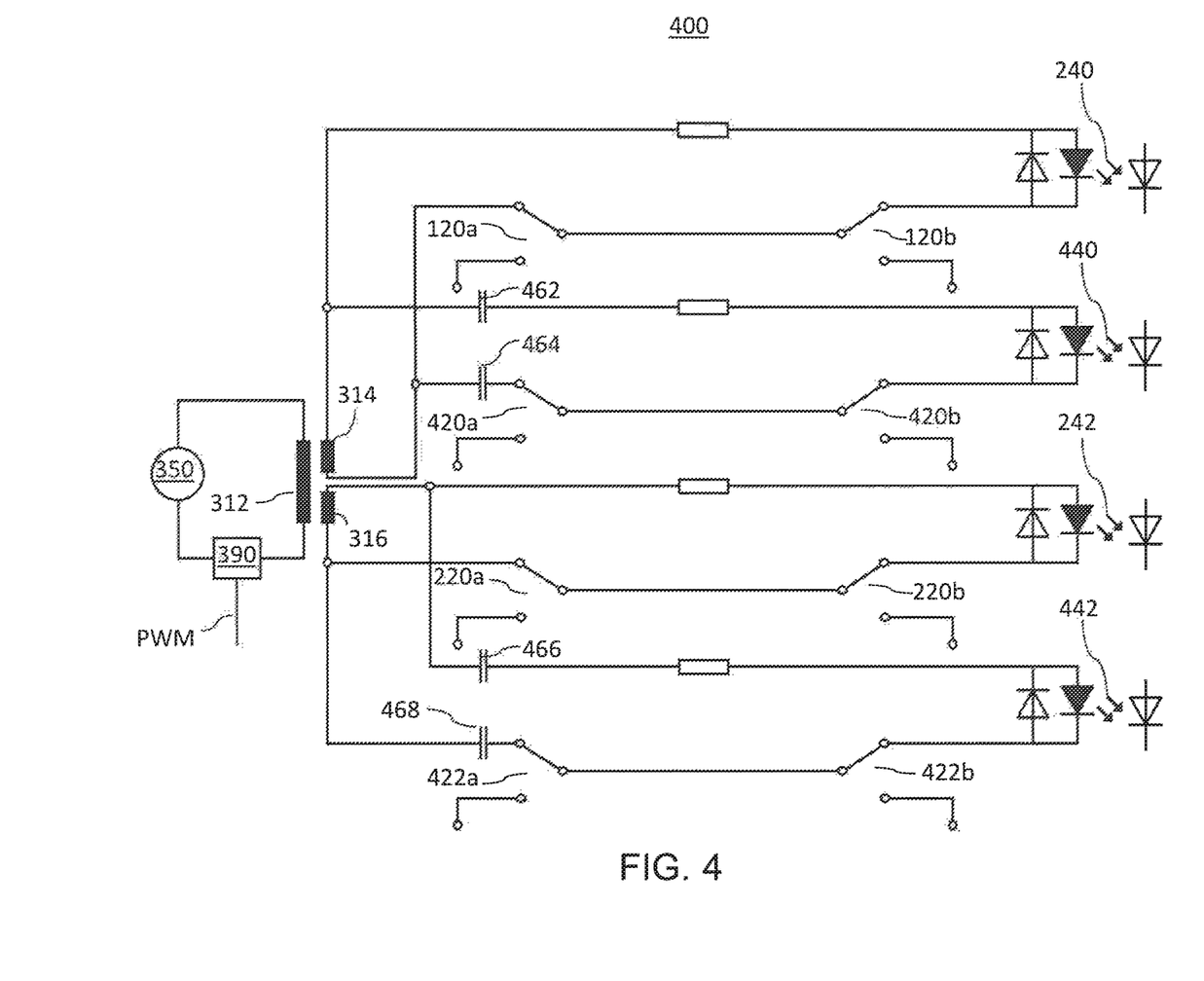
FIG. 4 is a circuit diagram illustrating a safety switch device comprising four safety circuits for verifying a switching state of eight switching elements, according to yet another embodiment of the invention.

FIG. 4 depicts another embodiment of the present invention. Safety switch device 400 comprises a transformer 312 forming a first transformer 314 and a second transformer 316 to galvanically decouple the control circuit from the power supply of the load. Further, safety switch device 400 includes four safety circuits and four load circuits. Two safety circuits comprise the first transformer 314 and two safety circuits comprise the second transformer 316.

As depicted in FIG. 4, the switching position of four pairs of switching elements 120*a*/120*b*, 420*a*/420*b*, 220*a*/220*b* and 422*a*/422*b* can be verified by four safety circuits. A first safety circuit comprises optocoupler 240, switching elements 120*a* and 120*b*, and first transformer 314; a second safety circuit comprises optocoupler 440, switching elements 420*a* and 420*b*, and first transformer 314; a third safety circuit comprises optocoupler 242, switching elements 220*a* and 220*b*, and second transformer 316; and a fourth safety circuit comprises optocoupler 442, switching elements 422*a* and 422*b*, and second transformer 316.

According to an embodiment, one or more safety circuits may comprise a secondary insulation, wherein the transformer comprising the first and second transformer is the primary insulation to protect the safety circuit from the power supply of the load.

For example, with respect to FIG. 4, the second safety circuit comprising switching elements 420*a* and 420*b*, and the fourth safety circuit comprising switching, elements 422*a*/422*b* further comprise a secondary insulation. In more detail, the second safety circuit comprising switching elements 420*a* and 420*b* further comprises capacitors 462 and 464 as secondary insulation and the fourth safety circuit comprising switching elements 422*a* and 422*b* further comprises capacitors 466 and 468 as a secondary insulation.

According to one embodiment, a plurality of switching elements may be connected to one relay. For example, the safety switch device of FIG. 4 may comprise four relays (not shown) controlling all eight switching elements 120*a*, 120*b*, 220*a*, 220*b*, 420*a*, 420*b*, 422*a* and 422*b*. In more detail, a first relay (the coil of the relay) may be connected to the two switching elements 120*a* and 420*a*, a second relay may be connected to the two switching elements 120*b* and 420*b*, a third relay may be connected to the two switching elements 220*a* and 422*a*, and a fourth relay may be connected to the two switching elements 220*b* and 422*b*. Accordingly, two switching elements belong to one relay and are driven jointly.

Advantageously, this may allow cross fault detection. In particular, having one relay in contact with two switching elements of different safety circuits allows to more precisely determine if a relay is defective or not working properly. For example, with respect to FIG. 4, a first relay, being connected to the two switching elements 120*a* and 420*a*, is defect and/or in a fault switching state. Since the first relay is connected to both switching elements 120*a* and 420*a* and these switching elements are driven jointly, it does not matter on which switching element of the two switching elements 120*a* and 420*a* the error occurred. Both switching elements 120*a* and 420*a* are in a fault switching position. Advantageously, an improved safety switch device is provided to verify a switching position of switching elements in a redundant and reliable manner.

Accordingly, a test signal will not be detected by optocoupler 240 and a test signal will not be detected by optocoupler 440 as well. Thus, the fault switching position will be detected in two safety circuits. Therefore, a switching state of the first set of two switching elements 120*a* and 120*b* (first safety circuit), and a switching state of the second set of two switching elements 420*a* and 420*b* (second safety circuit) cannot be verified. The safety switch device determines an error. Advantageously, a redundant system for detecting errors may be provided. Specifically, a defective state or condition can be detected and determined, even if one of the optocouplers 240 and 440 is also defective. An opotcoupler that does not send any signal to the microprocessor for evaluation to verify a switching state may not be of a big problem, since this will be detected by the microprocessor (missing signal). However, if a defective optocoupler indicates a wrong signal, which is similar to the signal under normal conditions (faultless condition), this defective condition may only be detected with this redundant system by detecting it with the other still functional optocoupler.

According to another embodiment, each of the switching elements 120*a*, 120*b*, 220*a*, 220*b*, 420*a*, 420*b*, 422*a* and 422*b* is connected to only one relay. Accordingly, each switching element is driven separately by a coil of a respective relay. In this manner, eight relays are used to drive eight switching elements. A switching element may be a relay, part of a relay or connected to a relay.

To further increase the safety of the safety switch device, different test signals can be provided to the four safety circuits of FIG. 4. For example, to provide different signals to each safety circuit, the transformers 314 and 316 may be different. For example, the transformers 314 and 316 may have different coils. Accordingly, the test signal for each safety circuit may be altered by different components and/or a different arrangement of components and/or a different combination of components for the respective safety circuit. Furthermore, the safety switch device may comprise additional overvoltage protection protecting the safety switch device from the power supply of the load.

Furthermore, other components, like capacitors 462, 464, 466 and 468 or filters, may be included in one or more safety circuits to alter the test signal to an altered test signal that is unique for each safety circuit. Accordingly, each of the optocouplers detects a unique signal. This may allow determining fault conditions more precisely. This further may allow summarizing the signals from each optocoupler, which may save space and components.

For example, a microprocessor can evaluate a combined signal from the plurality of safety circuits or each signal individually. The combined signal could also be indicating in which safety circuit an error occurred, if the test signals are different for each safety circuit. This allows more precisely detecting an error or a defective state of the switching elements.

Tests may be performed before a switching operation will be performed, for example, before closing a load circuit, and/or after a switching operation will be performed, for example, after opening a load circuit. Tests may be performed directly before/after the switching operation or test may be performed before/after a certain amount of time before/after the switching operation. In some cases, the test signals may be similar to load circuit signals. Thus, it may be hard to determine a defective switching state. In order to check whether a load circuit signal can be interpreted as a test signal, a measurement without a test signal can additionally be carried out. In addition, signals of the different safety circuits may be different. As already described above, this makes it possible to determine short circuits.

The testing of the switching state may only be performed if the relays are de-energized. This ensures that a test signal from the signal source is never applied to the load circuit. Advantageously, changeover switches are used to completely separate the load circuit from the safety circuit during normal operation. Therefore, the test signal from the signal source will only be provided when the switching operation has been safely carried out after a known switching time of the relays.

The safety switch device is configured to determine and/or verify whether two series-connected switching elements in the de-energized state are in a switching position in which the switching elements close the safety circuit. A switching operation to close a load circuit or to connect a power supply with a load may only be performed, if a switching state of the switching elements is verified. The switching time of the relays is effected, in particular, with regard to evaluation, for example, by a microprocessor. The controller can then check whether the signals from a safety circuit are set as predefined.

In this arrangement the contacts of the switching elements are connected to the safety circuit. An operation of changing over to the other state is preferably carried out only when the safety circuit detects a closed safety circuit. The safety circuit may only be closed when all switching elements of the safety circuit are closed. Otherwise, the safety switch device may indicate an error signal and/or initiates a suitable countermeasure.

In one embodiment, the microcontroller determines a defective state although the relays are in an energized state. The switching elements are closing the load circuit and are opening the safety circuit in an energized state. Accordingly, under normal condition (faultless condition) no signals should be detected by the optocoupler. However, a signal detected by the optocoupler will be provided to the microprocessor. The microprocessor determines a fault condition based on the signal being detected when the safety circuit should be open.

Moreover, a safety circuit may comprise two sets of two switching elements being connected in series, forming a safety circuit with four or more switching elements. Accordingly, one safety circuit may verify switching states of two sets of two switching elements. Each set of the two sets of two switching elements may be part of a different load circuit. Each set of the two sets of two switching elements may be configured to connect/disconnect a load to/from a power supply.

The embodiments explained with respect to FIGS. 1 to 4 or components of the depicted embodiments can be combined in a plurality of combinations to advantageously achieve technical effects. For example, the transformer shown in FIG. 4 could also be used in the safety switch device of FIG. 2, wherein the first secondary transformer is connected to the first safety circuit and the second secondary transformer is connected to the second safety circuit. Another example for such a combination of features is the capacitors providing for the secondary insulation as depicted in FIG. 2 which could additionally be implemented in the safety switch devices of FIGS. 1, 3 and/or 4. As another example, the PWM controlled transistor could also be used in the safety switch device of FIGS. 1 and/or 2 to generate a test signal for the safety circuit.

Figure 5:
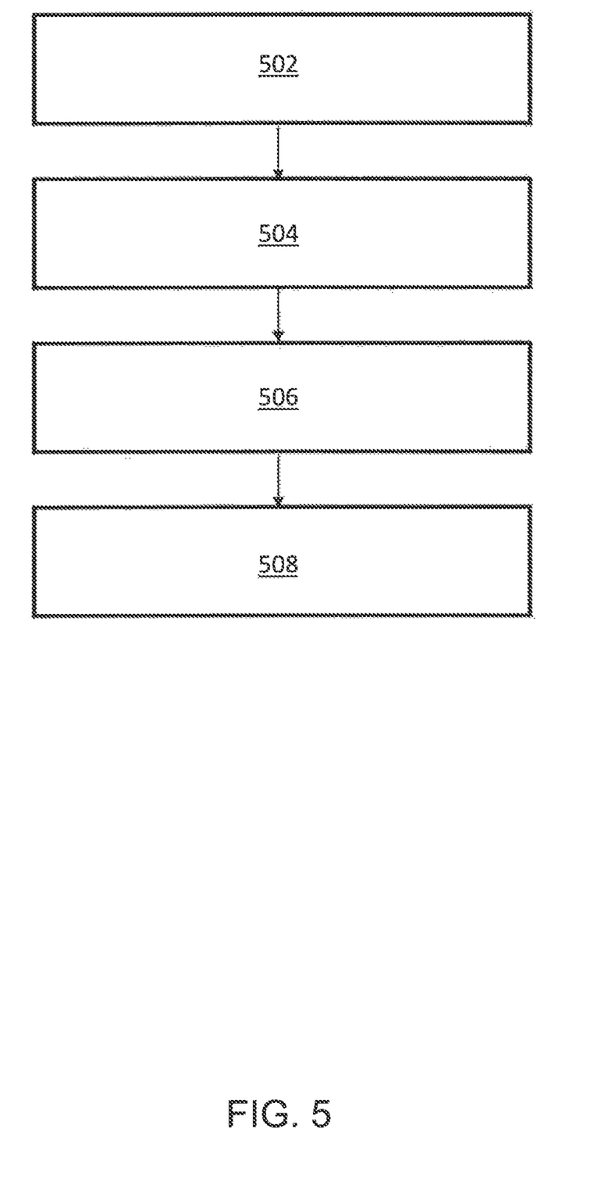
FIG. 5 is a flow diagram illustrating a method for operating a safety switch device.

FIG. 5 shows a method in accordance with the present invention. In particular, FIG. 5 shows a method for verifying the switching state of one or more sets of two switching elements. Step 502 comprises generating a test signal. The test signal may be generated by a control circuit. For example, the test signal may be generated by a transformer driver comprised in the control circuit. Moreover, the test signal may be configured by a PWM controlled transistor. The generated test signal may be at least one of a continuous AC test signal, a modulated test signal, and a temporary test signal.

Step 504 comprises providing the test signal to the safety circuit via a transformer that functions as decoupling means to galvanically decouple the control circuit from the power supply of the load. An advantage of this transformer solution may be a high and continuous current for the test signal that facilitates detection of the test signal. The transformer may have a primary winding and two or more secondary windings forming two or more respective secondary transformers. This allows for providing different test signals to the respective safety circuits of the two or more secondary transformers.

Step 506 comprises signaling or providing an indication of a switching state to verify the switching state of the first set of two switching elements. The indication of a switching state may be provided by means for detecting the test signal. The means for detecting the test signal may be one or more optocoupler.

In particular, an optocoupler may indicate a specific switching state by detecting a test signal. The specific switching state may be a switching state in which the switching elements close the safety circuit. The specific switching state of the switching elements may be a de-energized state. In particular, the switching elements, in an embodiment relays, are in a de-energized state if the safety circuit is closed and the load circuit open, and in an energized state if the load circuit is closed and the safety circuit open. Accordingly, the de-energized switching elements close the safety circuit in a faultless state.

According to a step 508 of the method, the indication of the switching state may be received at a microprocessor, wherein the indication of the switching state is provided by an optocoupler. In more detail, the optocoupler receives the test signal provided from the transformer driver via the transformer, due to the closed switching elements forming a closed safety circuit. The optocoupler is configured to provide a signal, which is based on the received test signal, to the microprocessor for an evaluation of the signal. The optocoupler only receives and/or detects the test signal if the switching elements are in a specific position, namely if the switching elements close the safety circuit and provide for an electrical connection between the optocoupler and the transformer.

If the optocoupler does not receive a test signal, the switching elements may be in a fault position. If the optocoupler receives a test signal, it may provide a signal to the microprocessor as an input that indicates that the switching elements are in an intended position. The microprocessor may evaluate the received signal and determine the switching state of the switching elements based on the received signal. Moreover, the microprocessor may verify and/or determine the switching state based on the received signal provided by the opotcoupler and one or more additional signals. These additional signals may comprise a target state of the switching elements. The microprocessor may compare the received signal and the one or more additional signals.

Moreover, the one or more additional signals may trigger the procedure to verify a switching state of the switching elements. The triggered procedure may comprise a method to verify the switching state of switching elements directly and/or after a predefined amount of time after the one or more additional signals have been received.

Furthermore, the test to verify the switching state may be performed before a load circuit is closed. For example, a signal indicating to close a load circuit may be received, and trigger the test to verify the switching state. After the test has been performed, the load circuit can be closed, if the switching elements are in a faultless state and/or a de-energized switching position.

Moreover, the microprocessor may indicate a functional state of the switching elements and/or the microprocessor may indicate a verified switching state of the switching elements.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A safety switch device configured to perform at least one of connecting a load to a power supply and disconnecting the load from the power supply, the safety switch device comprising:
    a first set of two serially connected controllable switching elements;
    a safety circuit to verify a switching state of the first set of two switching elements, wherein each switching element of the first set of two switching elements is configured as a toggle having a first contact electrically connected to either a second contact or a third contact, wherein the second contact is comprised in the safety circuit and the third contact is comprised in a load circuit comprising the load;
    a control circuit configured to provide a test signal to the safety circuit; and
    decoupling means configured to galvanically decouple the load circuit from the control circuit,
    wherein the decoupling means comprise a transformer, and the control circuit comprises a transformer driver configured to provide the test signal to the safety circuit via the transformer, and
    wherein a secondary winding of the transformer has a first terminal and a second terminal, the first terminal connected in series with a detection device, the detection device is connected in series between the first terminal and the second contact of a first switching element from the first set of two switching elements and the second terminal connected in series with the second contact of a second switching element from the first set of two switching elements.

2. The safety switch device of claim 1, wherein the transformer has a primary winding and two secondary windings forming a first transformer and a second transformer.

3. The safety switch device of claim 2, further comprising a second safety circuit, wherein the second safety circuit comprises a second set of two serially connected controllable switching elements being electrically connected to another secondary winding defining the second transformer, and
    wherein the first set of two serially connected controllable switching elements is electrically connected to the secondary winding defining the first transformer.

4. The safety switch device of claim 3, further comprising:
    a third safety circuit, wherein the third safety circuit comprises a third set of two serially connected controllable switching elements being electrically connected to the secondary winding for the first transformer; and
    a fourth safety circuit, wherein the fourth safety circuit comprises a fourth set of two serially connected controllable switching elements being electrically connected to the other secondary winding for the second transformer.

5. The safety switch device of claim 1, further comprising a second safety circuit, wherein the second safety circuit comprises a second set of two serially connected controllable switching elements.

6. The safety switch of claim 1, wherein at least one safety circuit further comprises one or more capacitors providing a secondary insulation, wherein the transformer provides for a primary insulation.

7. The safety switch device of claim 1, wherein one or more of the switching elements are controlled by one or more relays.

8. The safety switch device of claim 1, wherein the transformer driver comprises a microprocessor and a driver for generating the test signal.

9. The safety switch device of claim 1, wherein the test signal is at least one of:
    a continuous AC test signal,
    a modulated test signal, and
    a temporary test signal.

10. The safety switch device of claim 1, wherein:
    the transformer driver comprises a microprocessor and a driver for generating the test signal, and
    the test signal is at least one of:
        a continuous AC test signal,
        a modulated test signal, and
        a temporary test signal.

11. The safety switch device of claim 1, wherein the control circuit further comprises a PWM controlled transistor for generating the test signal.

12. The safety switch device of claim 1 further comprising a capacitor connected in series between the decoupling means and the first set of two switching elements.

13. A safety switch device configured to perform at least one of connecting a load to a power supply and disconnecting the load from the power supply, the safety switch device comprising:
    a first set of two serially connected controllable switching elements;
    a safety circuit to verify a switching state of the first set of two switching elements, wherein each switching element of the first set of two switching elements is configured as a toggle having a first contact electrically connected to either a second contact or a third contact, wherein the second contact is comprised in the safety circuit and the third contact is comprised in a load circuit comprising the load;

a control circuit configured to provide a test signal to the safety circuit;

an optocoupler configured to receive the test signal, wherein the optocoupler is configured to only receive the test signal if both switching elements of the first set of two switching elements close the safety circuit; and decoupling means configured to galvanically decouple the load circuit from the control circuit, wherein the decoupling means comprise a transformer, and the control circuit comprises a transformer driver configured to provide the test signal to the safety circuit via the transformer.

14. The safety switch device of claim 13, wherein the optocoupler is configured to indicate at least one of:
a current detected in the safety circuit;
the received test signal;
the switching state of the first set of two switching elements; and
whether the first set of two serially connected controllable switching elements is in a switching position of a de-energized state, in which the first set of two switching elements close the safety circuit.

15. The safety switch of claim 13, further comprising a microprocessor, wherein the microprocessor receives a signal from the optocoupler and verifies the switching state based on the signal from the optocoupler.

16. A method for verifying a switching state of a first set of two switching elements, wherein the first set of two switching elements performs at least one of connecting a load to a power supply and disconnecting the load from the power supply, the method comprising the steps of:
generating a test signal by a control circuit;
providing the test signal to a safety circuit via a transformer that functions as decoupling means to galvanically decouple the control circuit from the power supply of the load, wherein:
a secondary winding of the transformer has a first terminal and a second terminal,
the first terminal is connected in series with a detection device;
the detection device is connected in series between the first terminal of the secondary winding and a first switching element from the first set of two switching elements,
the second terminal is connected in series with a second switching element from the first set of two switching elements, and
the test signal is conducted in a complete circuit through the secondary winding of the transformer, the detection device, the first switching element, and the second switching element; and
signaling an indication of a switching state to verify the switching state of the first set of two switching elements.

17. The method of claim 16, further comprising the step of generating the test signal by a PWM controlled transistor comprised in the control circuit.

18. The method of claim 16 further comprising the step of receiving the indication of the switching state at a microprocessor, wherein the indication of the switching state is provided by an optocoupler.

19. The method of claim 16 steps of:
generating the test signal by a PWM controlled transistor comprised in the control circuit, and
receiving the indication of the switching state at a microprocessor, wherein the indication of the switching state is provided by an optocoupler.

20. The method of claim 16 wherein the safety circuit includes a second set of two switching elements, the method further comprising the steps of:
generating a second test signal by the control circuit,
providing the second test signal to the second set of two switching elements via the transformer, and
signaling an indication of a switching state of the second set of two switching elements.

* * * * *